United States Patent

Anderson et al.

[11] Patent Number: 6,058,016
[45] Date of Patent: May 2, 2000

[54] DIRECT DOCK STORAGE DEVICE CARRIER

[75] Inventors: Dale H. Anderson, Tucson, Ariz.; Donald M. Connelly, Jr.; Kenton C. Green, both of San Jose, Calif.

[73] Assignee: International Business Machines Corporation, Armonk, N.Y.

[21] Appl. No.: 09/151,082

[22] Filed: Sep. 10, 1998

[51] Int. Cl.[7] ...................................................... G06F 1/16
[52] U.S. Cl. ........................ 361/727; 361/685; 312/223.2
[58] Field of Search .................................... 361/727, 685; 361/223.2

[56] References Cited

U.S. PATENT DOCUMENTS

| | | |
|---|---|---|
| 4,232,356 | 11/1980 | Saunders et al. . |
| 4,833,554 | 5/1989 | Dalziel et al. . |
| 4,845,589 | 7/1989 | Weidler et al. . |
| 4,853,830 | 8/1989 | Corfits et al. . |
| 4,977,532 | 12/1990 | Borkowicz et al. . |
| 4,979,909 | 12/1990 | Andrews . |
| 4,982,303 | 1/1991 | Krenz . |
| 5,010,426 | 4/1991 | Krenz . |
| 5,019,948 | 5/1991 | Steketee et al. . |
| 5,020,926 | 6/1991 | Wilhelm . |
| 5,045,960 | 9/1991 | Eding . |
| 5,067,041 | 11/1991 | Cooke et al. . |
| 5,124,886 | 6/1992 | Golobay . |
| 5,142,447 | 8/1992 | Cooke et al. . |
| 5,211,566 | 5/1993 | Bates et al. . |
| 5,212,681 | 5/1993 | Bock et al. . |
| 5,262,923 | 11/1993 | Batta et al. . |
| 5,277,615 | 1/1994 | Hastings et al. . |
| 5,327,323 | 7/1994 | Yeom et al. ............................. 361/685 |
| 5,502,604 | 3/1996 | Furay . |
| 5,510,955 | 4/1996 | Taesang . |
| 5,539,616 | 7/1996 | Kikinis ................................... 361/727 |
| 5,552,946 | 9/1996 | Bicknese et al. . |
| 5,586,003 | 12/1996 | Schmitt et al. . |
| 5,654,873 | 8/1997 | Smithson et al. ....................... 361/685 |
| 5,734,557 | 3/1998 | McAnally et al. ...................... 361/727 |

*Primary Examiner*—Leo P. Picard
*Assistant Examiner*—John D. Reed
*Attorney, Agent, or Firm*—Ohlandt, Greeley, Ruggiero & Perle

[57] ABSTRACT

The present invention is a system for direct docking of a storage device/carrier to a back plane of a support frame. The system includes a storage device/carrier including guidance tracks. Guidance rails are connected to the support frame, engage the guidance tracks respectively and guide and support the storage device/carrier into a mating engagement with a connector on a backplane of the support frame. Each guidance rail includes at least one spring element which raises the storage device/carrier away from the support frame as it is inserted thereinto. Further, the storage device/carrier includes opposed, outwardly extending spring elements which bear against the support frame. In operation, the opposed spring elements on the storage device/carrier are compressed as the storage device/carrier is inserted onto the guidance rails and bias the storage device/carrier against the support frame. As the storage device carrier engages with a connector, a reduced cross section region of the guidance tracks engage the sides of the guidance rails, thereby reducing slack between the guidance tracks and the guidance rails.

5 Claims, 5 Drawing Sheets

DIRECT DOCK STORAGE DEVICE CARRIER

FIELD OF THE INVENTION

The present invention relates to storage device carriers and, more particularly, to a storage device carrier with direct docking capabilities.

BACKGROUND OF THE INVENTION

Computer systems utilize various storage media and associated devices to store data. These storage devices are generally placed in bays within a computer chassis. In many such computer systems, it is essential that these devices be easily accessible. Thus, external openings are often provided which enable direct access to components of the computer system.

In order to insert a device into its respective bay, carriers are frequently used as platforms to hold the device. These carriers are designed to secure the device and to provide for smooth insertion into a bay and to assure a proper electrical connection between the device and the system.

A standard approach for packaging storage devices (e.g., disk drives, diskette drives, etc.) to a computer enclosure is shown in FIG. 5. Rails are attached to a disk drive, and the assembly then slides onto mating tracks which are attached to a housing or base enclosure. A latch is provided to snap over the end of the rail after insertion of the drive. No screws are required to lock the storage device into the computer enclosure.

While the above method captures the storage device, the tolerances required to manufacture the various parts may cause the storage device to be loose within the tracks and with respect to the spring wire latch and to vibrate or to be affected by vibrations generated from neighboring devices. Such problems may cause the disk drive to operate improperly.

One possible approach to remedying the looseness problem is found U.S. Pat. No. 4,853,830 to Corfits which describes a guide rail system for alignment and locking of a removable magnetic storage device. The system utilizes three spring fingers, molded as part of a carrier base, which function to eliminate slack or play between the carrier base and frame by biasing the component-cage assembly toward the opposite guide channel.

U.S. Pat. No. 5,212,681 to Bock et al. provides a cartridge positioning and interlock apparatus which includes a pair of tapered channels for providing a guide that initially has significant tolerance variation for the insertion of the disk drive cartridge. As the disk drive cartridge is inserted in the opening, the tapered channels provide a tighter conforming fit to provide precise alignment of the disk drive cartridge within the opening. The disk drive cartridge is locked into place through the use of a camming apparatus that forces the disk drive cartridge to seat in the opening.

Although the prior art arrangements provide a variety of means for securing a device into a housing of a computer system, they do not provide an adequate method and apparatus for directly docking a storage device. That is, the prior art does not adequately minimize looseness and vibrations. Moreover, such prior art systems are bulky and require a substantial amount of space in the computer chassis.

There is a need to provide an improved storage device/carrier arrangement that reduces looseness of a drive enclosure within receiving tracks and with respect to a spring wire latch. More specifically, there is a need to provide a storage device/carrier arrangement that minimizes vibrations at and around the storage device/carrier, while allowing the device to be quickly and efficiently docked into a support frame of a computer system.

Accordingly, it is an object of the present invention to provide a storage device carrier that reduces the looseness of a storage device/carrier within receiving tracks.

It is a further object of the present invention to minimize vibration at and around a storage device/carrier to minimize errors during operation.

It is another object of the present invention to provide a storage device/carrier that can be quickly and efficiently docked into a support frame of a computer system.

Another object of the present invention is to provide a storage device carrier that can be easily installed.

It is also an object of the present invention to provide a compact storage device/assembly that requires minimal space in a computer chassis.

SUMMARY OF THE INVENTION

The present invention is a system for direct docking of a storage device/carrier to a back plane of a support frame. The system comprises a storage device/carrier including guidance tracks. Guidance rails are connected to a support frame and engage the guidance tracks respectively, for guiding and supporting the storage device/carrier into a mating engagement with a connector on a backplane of the support frame. Each guidance rail includes at least one mounting spring extending from a surface thereof which raises the storage device/carrier away from the support frame as it is inserted thereinto. Further, the storage device/carrier includes opposed, outwardly extending spring elements which bear against the support frame. In operation, the opposed spring elements on the storage device/carrier are compressed as the storage device/carrier is inserted onto the guidance rails and bias the storage device/carrier against the support frame. The dimensions of the guidance rails and tracks are such as to allow transverse movement therebetween so as to allow positional adjustment of the storage carrier/device during engagement with the connector. As the storage device carrier engages with the connector, a reduced cross section region of the guidance tracks engage the sides of the guidance rails, thereby reducing slack between the guidance tracks and the guidance rails. Such arrangement thereby tightly grips the storage device/carrier, both in the major plane thereof and transverse to the major plane.

DETAILED DESCRIPTION OF THE PREFERRED EMBODIMENTS

Figure 1:
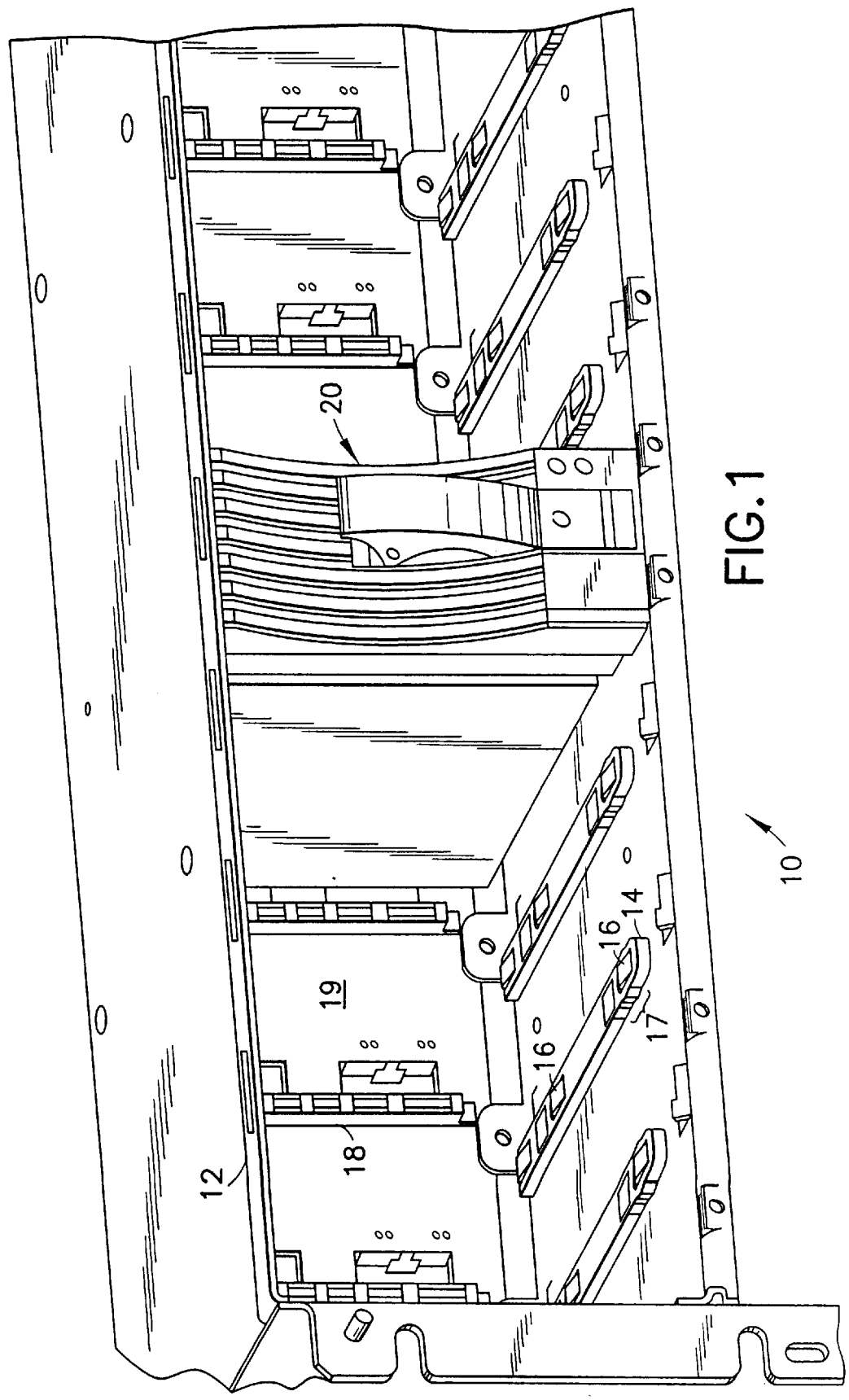
FIG. 1 illustrates a storage carrier system for a computer system that includes a plurality of guide rails, arranged in a support frame, for guiding and mounting a storage device carrier assembly into a support frame.
Figure 2:
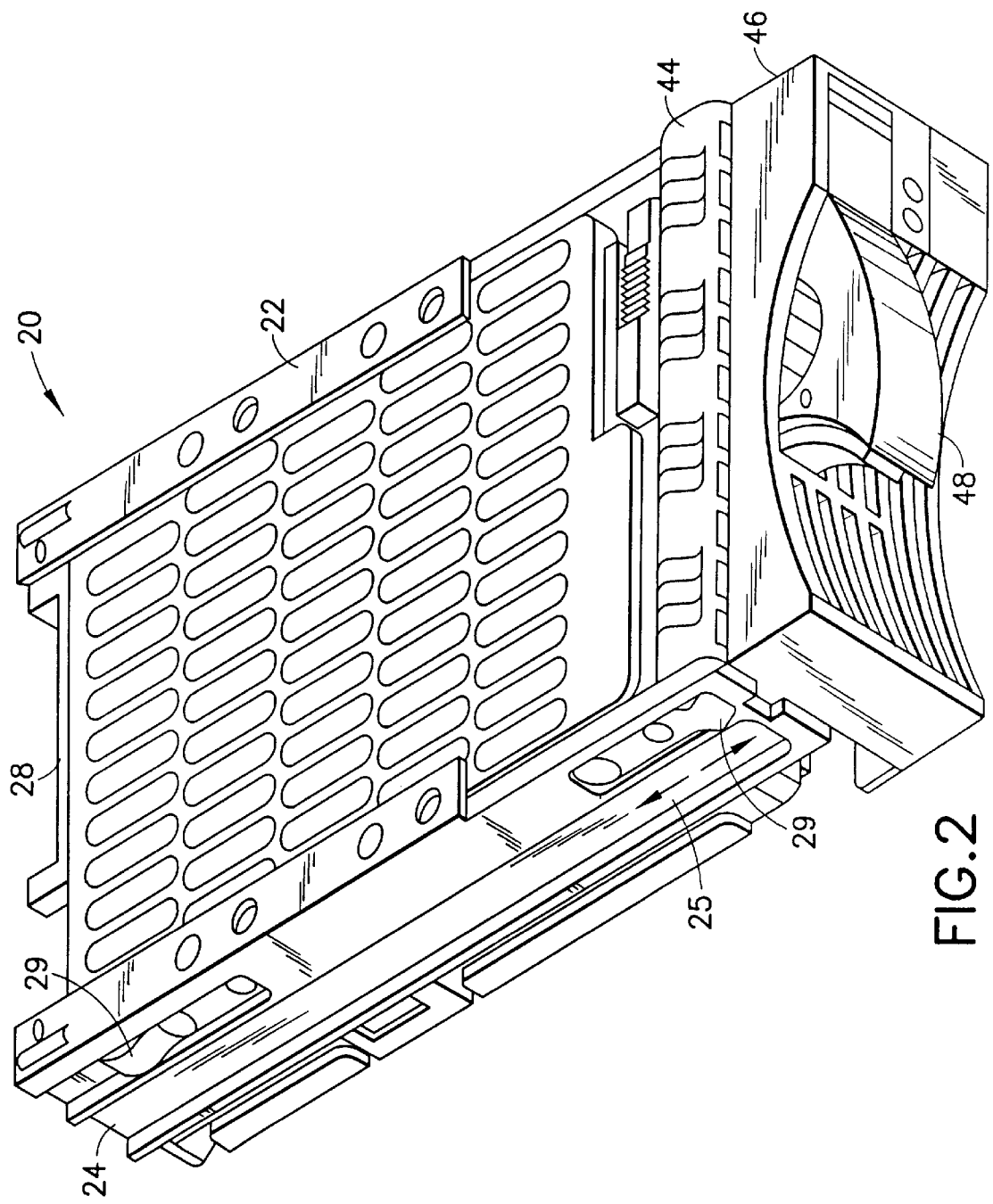
FIG. 2 illustrates a preferred storage carrier assembly of the present invention.

Referring to FIGS. 1 and 2, there is provided a storage device carrier system 10 which includes a support frame 12 for housing components of a computer system. Support frame 12 includes at least one mating connector 18 for interconnection with devices, such as a storage device (e.g., a hard disk drive, a diskette drive). Support frame 12 has mounted therein at least one pair of guide rails 14, on opposing interior sides of support frame 12. Each guide rail 14 includes at least one flexible arm 16 extending from a surface of the guide rail and a reduced cross section segment 17.

A storage device carrier assembly 20 (hereafter assembly 20) for holding a storage device 21 (e.g., the disk drive shown in FIG. 3) includes at least a pair of tracks 24 that are arranged on opposing exterior sides of the storage assembly 20 and are adapted to engage respective guide rails 14 of support frame 12. Note that each track 24 includes a reduced width segment 25 which is adapted to receive a segment 17 of a respectively inserted guide rail 14, but only at the end of travel of guide rail 14 and after initial engagement with connector 18. The width of track 24 is set so that a rail 14 that is engaged therewith has some freedom of lateral movement until a mating action occurs with a connector 18. At such point, segment 17 of a guidance rail 14 becomes tightly gripped by reduced width segment 25 of mating track 24. In such manner, one end of assembly 20 is confined by connector 18, and the other end is confined by interaction between a reduced width guidance rail segment 17 and a mating reduced width guidance track segment 25.

Assembly 20 further includes a plurality of spring elements 29 on opposed sides thereof which are positioned to engage the walls of support frame 12 upon insertion of assembly onto guidance tracks 14. Spring elements 29 act to bias assembly 20 tightly against the walls of support frame 12 and prevent movement of assembly 20 in a plane that is parallel to the the major planar dimension thereof.

In a direct docking operation, assembly 20 is inserted into support frame 12 so that each track 24 is in sliding engagement with a respective guidance rail 14. As guidance rails 14 engage guidance tracks 24, flexible arms 16 act to lift storage assembly 20 away from the guidance rails as it is slid towards a back plane 19 (and connector 18). At the same time, spring elements are compressed and firmly position assembly 20.

Guidance rails 14 guide and align assembly 20, particularly a connector 28 mounted on the back thereof, with a mating connector 18. As indicated above, tracks 24 enable guidance rails 14 to have sufficient lateral leeway to allow connector 28 of storage assembly 20 to be directly docked into mating connector 18. Once storage assembly 20 is docked, flexible arms 16 on guide rails 14 significantly reduce vibrations at and around storage assembly 20, such as vibrations caused by neighboring devices and the surrounding environment.

The present invention provides a compact storage device/carrier that can be directly docked into or removed from a support frame of a computer system in a rapid, safe and efficient manner. The present invention also significantly reduces the looseness or slack between the guidance rails and the guidance tracks so that the storage assembly is tightly secured in the support frame. Such arrangement provides a more compact storage device/carrier assembly and, thus, reduces the space needed (in the support frame) to house the storage assembly.

Figure 3:
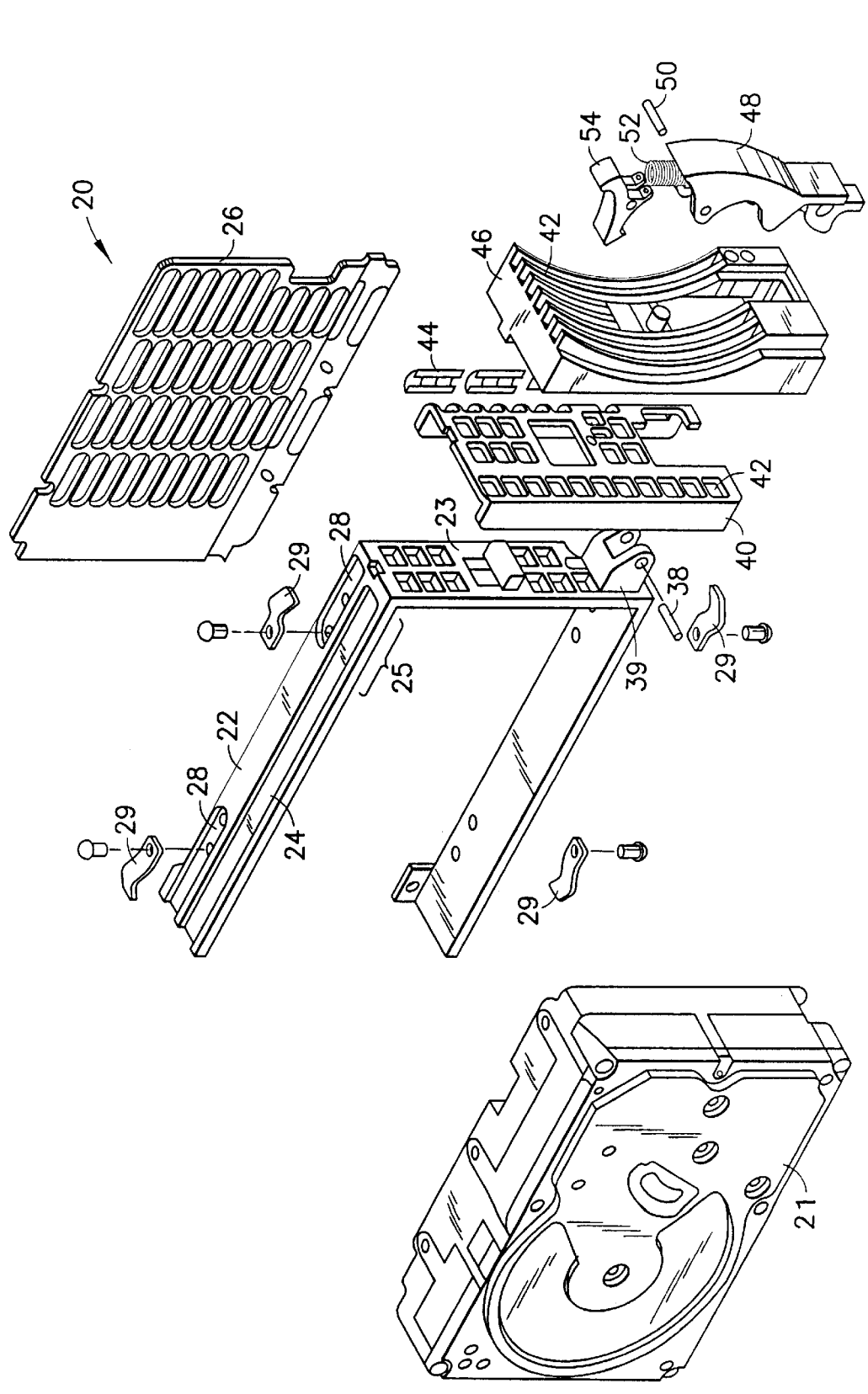
FIG. 3 illustrates an exploded view of the components of the preferred storage device carrier assembly of FIG. 2.

FIG. 3 illustrates the components of storage assembly 20, which includes a carrier 22 for holding storage device 21. Carrier 22 includes a front end 23 which includes a plurality of openings to allow cooling air to flow about storage device 21. Carrier 22 is preferably made of a thermally conducting material, preferably diecast zinc, which provides rigidity and assists in heat dissipation.

A perforated sheet metal element 26 forms one wall of carrier 22, while the upper surface of the casing of disk drive 21 forms an opposing wall. The perforations in element 26 enable cooling airflow about and around a circuit board (not shown) in disk drive 21. A connector (not shown) is mounted on the end of disk drive 21 and mates with connector 18 (FIG. 1) upon full docking of assembly 20.

Tracks 24 are positioned on upper and lower sides of carrier 22. Both tracks 24 receive mating guide rails 14 (FIG. 1) during a docking operation. In this way, storage assembly 20 is slidingly received by support frame 12. Spring elements 29 fit within recesses 28 in carrier 22.

Referring still to FIG. 3, storage assembly 20 preferably includes electromagnetic compatibility (EMC) or radio frequency interference (RFI) shielding 40 connected to front end 23 of carrier 22. A plurality of resilient EMC clips 44 attach to the edges of shielding 40 and bear upon the edges of immediately adjacent shielding 40 on adjoining storage assemblies 20. Shielding 40, along with EMC clips 44, form a frontal EMC shield for storage device carrier system 10 and further shield each storage device 21 from outside interference. Shielding 40 includes a plurality of openings 42 for allowing airflow therethrough.

A front panel 46 includes a plurality of slots 42 to allow airflow therethrough to assist in heat dissipation. A lever 48 is pivotally connected to front end 23 of carrier 22 via a pin 38 and hinge 39. A latch 54 is pivotally connected to lever 48, by a compression spring 52 and a pin 50. Once storage assembly 20 is docked into support frame 12, lever 48 can be pivoted to a closed position to lock storage assembly 20 into the supporting structure (and vice versa to allow removal thereof).

Figure 4:
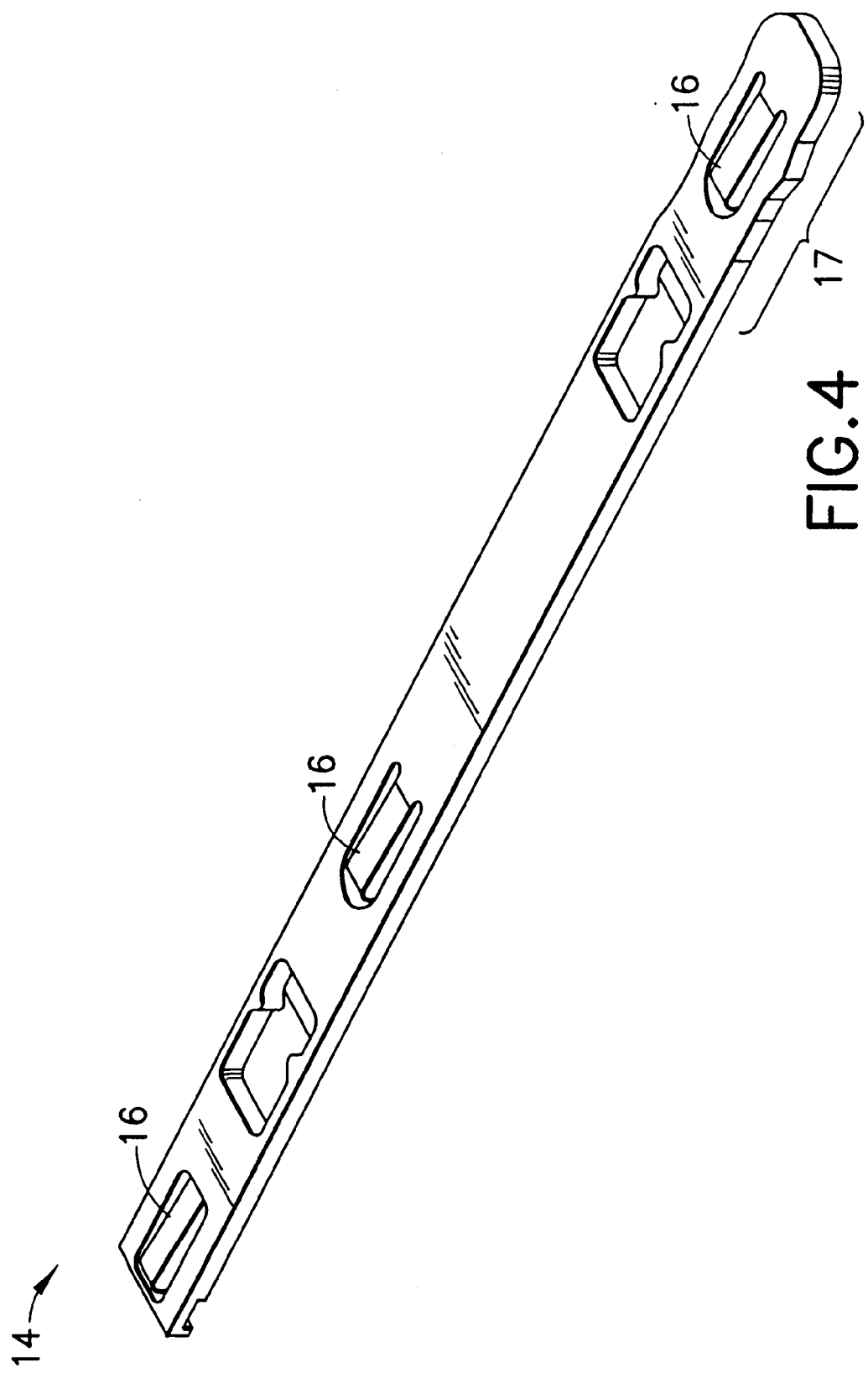
FIG. 4 illustrates a guide rail of FIG. 1.
Figure 5:
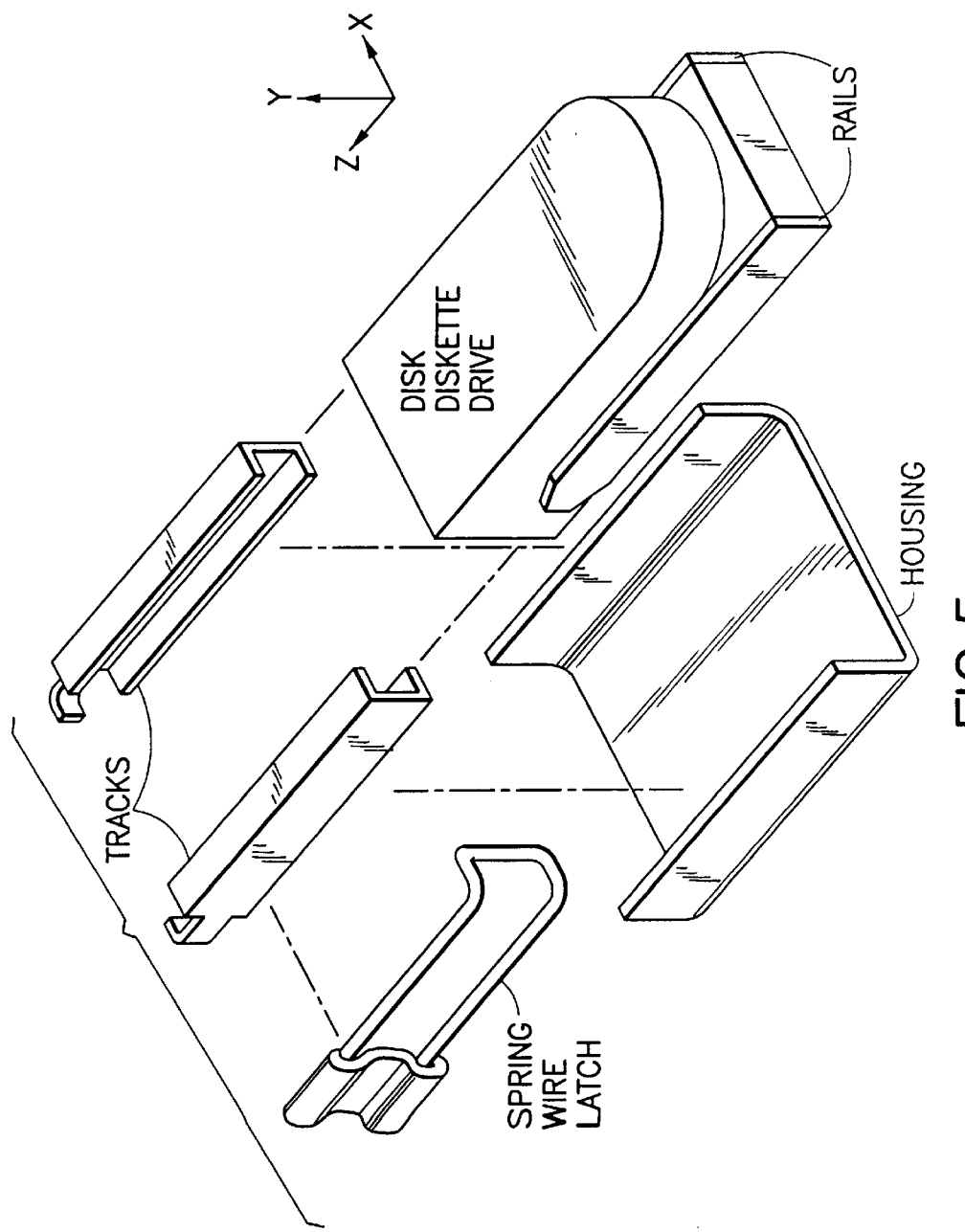
FIG. 5 illustrates an exploded view of a storage device carrier assembly of the prior art.

FIG. 4 is a perspective view of a guide rail 14. Guide rail 14 includes at least one flexible arm 16 and preferably a plurality, that extend above the surface of a guide rail 14. During insertion, flexible arms 16 lift a storage assembly 20 away from contact with surfaces of support frame 12. Flexible arms 16, in combination with spring elements 29, eliminate vertical slack between guide rails 14 and storage assembly 20 and absorb vibrations from the storage device, neighboring devices and the surrounding environment.

Although FIGS. 1 through 4 illustrate preferred embodiments of guide rails 14 and flexible arms 16, there are other possible variations (e.g., size, shape, material) which provide the same functionality. Furthermore, the placement of tracks 24 and guide rails 14 may be reversed so that track 24 are connected (or integral) to support frame 12 and guide rails 14 are connected (or integral) to storage device carrier assembly 20.

An example of a direct docking operation of storage assembly 20 (e.g., carrier/storage device) into support frame 12 is provided hereafter. Initially, at least a pair of guide rails 14 are mounted in support frame 12, on opposite interior surfaces thereof. Lever 48 is in the open position. As storage assembly 20 is inserted into support frame 12, flexible arms 16 of guide rails 14 are lift storage assembly 20 away from surfaces of storage frame 12. At the same time, spring elements 29 are compressed as storage assembly 20 is slid into a docking position thereover. Storage assembly 20 is moved towards back plane 19 of support frame 12 until its connector engages and plugs into mating connector 18 of the back plane.

Once storage assembly 20 is docked to back plane 19, lever 48 is pivoted to the closed position to lock the storage assembly into support frame 12. Once seated, latch 54 locks storage assembly 20 into support frame 12. To remove storage assembly 20, latch 54 is released and lever 48 is pivoted to withdraw storage assembly 20 from support frame 12.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

What is claimed is:

1. A system for direct docking of a storage device/carrier to a back plane of a support frame, the system comprising:
    (a) a storage device/carrier;
    (b) guidance tracks connectable to one of said support frame and said storage device/carrier; and
    (c) guidance rails, connectable to another of said support frame and said storage device and adapted to engage said guidance tracks, respectively, for guiding and supporting said storage device/carrier into mating engagement with a mating connector on said back plane of said support frame, each of said guidance rails including at least one spring element extending from a surface thereof which is positioned to bear against an adjoining guidance track;
    (d) spring means mounted on said storage device/carrier and in opposition to said spring elements, said spring means caused by action of said spring elements to be compressed and to bear against said support frame upon installation of said storage device/carrier into said support frame so as to restrain said storage device/carrier from movement in a direction orthogonal to mating surfaces of said guidance rails and guidance tracks.

2. The system of claim 1, wherein each said guidance track is divided into at least two segments, a first said segment being positioned to initially receive a mating guidance rail and having internal dimensions which enable movement of said guidance rail parallel to said mating surfaces.

3. The system of claim 2, wherein each said guidance rail includes a nose section which manifests a reduced cross section from a remainder of said guidance rail and a second said segment of said guidance track includes a reduced cross-section segment which, when mated with said nose section restrains movement of said guidance rail in a plane parallel to said mating surfaces of said guidance rail and said guidance track.

4. The system of claim 1, wherein each guidance track includes peripheral walls which act to restrain a guidance rail upon insertion of said guidance rail thereinto.

5. The system of claim 3, further comprising:
    latch means for automatically locking said storage device/carrier in said support frame.

\* \* \* \* \*